United States Patent [19]

Mazzali

[11] Patent Number: 5,005,060
[45] Date of Patent: Apr. 2, 1991

[54] TABLECLOTH MEMORY MATRIX WITH STAGGERED EPROM CELLS

[75] Inventor: Stefano Mazzali, Milan, Italy

[73] Assignee: SGS-Thomson Microelectronics s.r.l., Milan, Italy

[21] Appl. No.: 326,809

[22] Filed: Mar. 21, 1989

[30] Foreign Application Priority Data

Apr. 12, 1988 [IT] Italy ................ 20169 A/88

[51] Int. Cl.$^5$ .................................. H01L 29/78
[52] U.S. Cl. ........................ 357/23.5; 357/45; 365/185
[58] Field of Search ............ 357/23.5, 45; 365/185

[56] References Cited

U.S. PATENT DOCUMENTS

| 4,207,585 | 6/1980 | Rao | 357/41 |
| 4,326,331 | 4/1982 | Gaterman | 29/571 |
| 4,377,818 | 3/1983 | Kuo et al. | 357/23 |
| 4,493,057 | 1/1985 | McElroy | 365/182 |
| 4,792,925 | 12/1988 | Corda et al. | 365/185 |
| 4,896,295 | 1/1990 | Corda | 365/185 |

Primary Examiner—Andrew J. James
Assistant Examiner—Don Monin
Attorney, Agent, or Firm—Sixbey, Friedman, Leedom & Ferguson

[57] ABSTRACT

The memory matrix comprises parallel and alternating source and drain lines, floating gate areas placed between the source and drain lines and control gate lines parallel to each other and perpendicular to the source and drain lines superimposed on the floating gate areas. The floating gate areas are arranged in rows parallel to the source and drain lines in positions longitudinally staggered in relation to those of the adjacent row in such a manner that the floating gate areas of one row underlie a first plurality of control gate lines and the floating gate areas of the adjacent row underlie a second plurality alternating with the first of the control gate lines. The floating gate areas together with the adjacent source and drain lines and with the superimposed control gate lines define respective EPROM cells arranged in a staggered manner in the memory matrix.

2 Claims, 1 Drawing Sheet

TABLECLOTH MEMORY MATRIX WITH STAGGERED EPROM CELLS

TECHNICAL FIELD

The present invention relates to a tablecloth memory matrix with staggered EPROM cells.

BACKGROUND OF THE INVENTION

In the manufacture of a memory matrix, in particular with EPROM cells, it is important to increase to the maximum the density of the individual cells in order to improve the performance of and utilize better the available area. This requires the search for and use of ever more advanced technologies, especially in photolithography, where the definition of ever smaller structures is required down to submicron dimensions such as 0.8 micron. Despite such technologies, it is ever more difficult to reduce cell size so that research is directed toward new structures capable of overcoming these problems.

In the field of EPROM cells, from the conventional configuration calling for pairs of control gate lines superimposed on and self-aligned with floating gate areas alternating with parallel source lines while drain contacts are placed between one gate line and the next of each pair the step was made a few years ago to a so-called 'tablecloth' configuration calling for parallel and alternating source and drain lines, floating gate areas placed between said source and drain lines, and parallel control gate lines perpendicular to said source and drain lines, superimposed on and self-aligned with said floating gate areas.

The new configuration is described better in Italian patent application 23479 A/84 filed 7 Nov. 1984 having a corresponding U.S. Pat. No. 4,792,925 assigned to the same assignee as the present application and has proven beneficial compared with the conventional one as regards size problems, achieving levels of miniaturization, cell density and compactness worthy of interest. The complexity of the decoder required to accede to the individual cells has however discouraged practical application.

To overcome this shortcoming the original tablecloth configuration was subsequently modified into a configuration called 'semitablecloth', which is structurally equivalent to the tablecloth configuration but which, thanks to appropriate electrical connections, has each cell made up of two semicells which are written and read simultaneously.

With the semitablecloth configuration, better described in Italian patent application 19656 A/87 filed 12 Mar. 1987 having a corresponding U.S. Pat. No. 4,896,295 of the same assignee it proved possible to use a conventional decoder. To this was added the important advantage of offering 100% redundancy, it being practically impossible that both the semicells of a given cell prove defective. On the other hand this configuration has the defect of occupying much space.

In view of this state of the art the object of the present invention is to accomplish a memory matrix with EPROM cells which would provide the dimensional and compactness virtues of the presently known tablecloth matrix while simplifying the access procedure in such a manner a to permit the use of a conventional decoder.

SUMMARY OF THE INVENTION

In accordance with the invention said object is achieved by a memory matrix with EPROM cells comprising parallel and alternate source and drain lines, floating gate areas placed between said source and drain lines, and parallel control gate lines perpendicular to said source and drain lines superimposed on said floating gate areas characterized in that said floating gate areas are arranged in rows parallel with said source and drain lines in longitudinally staggered positions in relation to those of the adjacent row in such a manner that the floating gate areas of one row underlie a first plurality of said control gate lines and the floating gate areas of the adjacent row underlie a second plurality of said control gate lines alternating with the first.

It is clear that the staggered arrangement of the floating gate areas determines a corresponding staggered arrangement of the various cells of the matrix and allows a quite compact structure with minimal dimensions even though there is no longer the redundancy of the semitablecloth matrix. At the same time it is possible to accede to the individual cells of the matrix by using a conventional decoder.

BRIEF DESCRIPTION OF THE DRAWINGS

The characteristics of the present invention will be made clearer in the following detailed description of one of its possible practical forms of embodiment illustrated as a nonlimiting example in the annexed drawings wherein.

DETAILED DESCRIPTION OF THE PREFERRED EMBODIMENT

Figure 1:
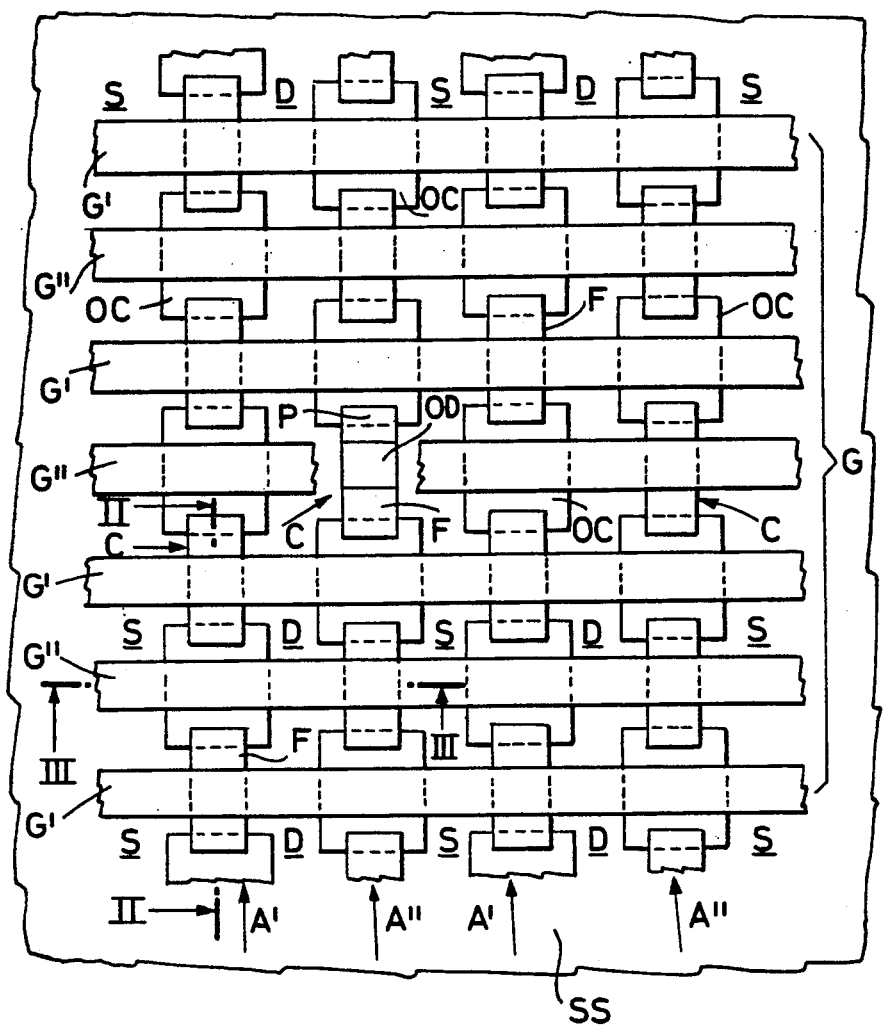
FIG. 1 shows a schematic plan view of a portion of am emory matrix with EPROM cells staggered in accordance with the present invention.
Figure 2:
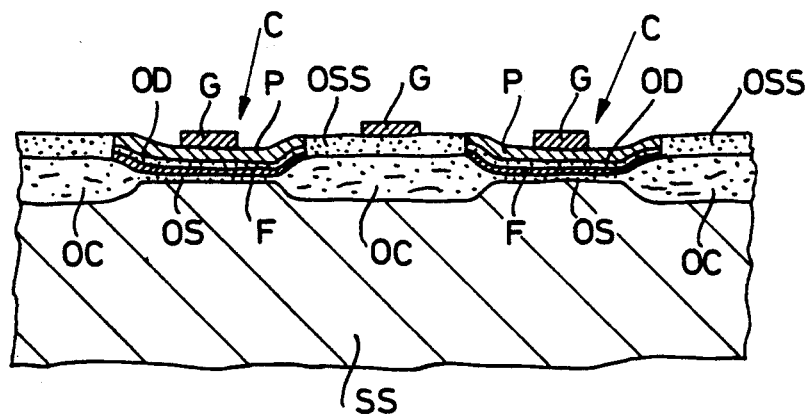
FIG. 2 shows an enlarged cross section along line II—II of FIG. 1 of a detail of said memory matrix.
Figure 3:
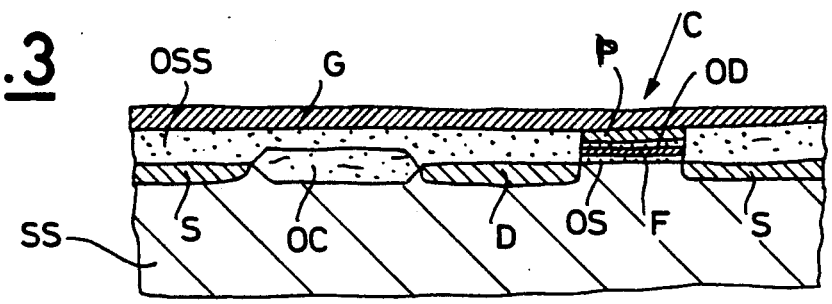
FIG. 3 shows an enlarged cross section along line III—III of FIG. 1 of another detail.

The so-called 'tablecloth' structure of FIG. 1 comprises a single-crystal silicon substrate SS on which are made by the diffusion of appropriate dope two pluralities of parallel alternating source S and drain D lines separated by field oxide areas OC. The whole is covered by a thin oxide layer OS (FIGS. 2 and 3).

Between each source line S and the adjacent drain line D there develops parallel to said lines a row of floating gate areas F each of which is made up (FIGS. 2 and 3) of a rectangular strip of polysilicon which extends over the thin oxide OS from one field oxide area OC to the other. On each strip there is a like layer of dielectric oxide OD replaceable by a composite layer of oxide-nitride-oxide (the so-called ONO) and over that another like strip of polysilicon P which forms a single body with a respective one of a plurality of control gate lines or bit lines G of silicide or polysilicide arranged parallel to each other and perpendicular to the source S and drain D lines. Each group F, OD, P together with the adjacent source S and drain D lines and with the superimposed control gate line G constitutes a respective elementary EPROM cell C isolated from the others through a thick oxide layer OSS.

As may be seen in FIG. 1 the cells C are arranged along parallel rows placed between the source S and drain D lines and those of one row are staggered longitudinally in relation to those of the adjacent row in the sense that the cells of a row A' have their own floating gate areas F overlaid by a first plurality of control gate lines G' while those of the adjacent row A" are overlaid by a second plurality of control gate lines G" alternating with the first.

From the described structure there derives the following manner of operation of the memory matrix. Desiring to write any cell C it is necessary to bring to writing voltage, e.g. 12 V, the control gate line (or 'bit line') G which passes through the selected cell while all the others must be held at low voltage or grounded. In addition writing voltage must be given to the drain line D of the selected cell while all the other drain D and source S lines are kept grounded. Reading must be performed in a similar manner, modifying the voltages applied but again making the selection through a control gate line G and a drain line D. It is thus possible to accede to a single cell at a time, with no need for using decoders different from conventional ones.

I claim:

1. Memory matrix with EPROM cells comprising parallel and alternating source and drain lines, floating gate areas placed between said source and drain lines and control gate lines parallel with each other and perpendicular to said source and drain lines superimposed on said floating gate areas, wherein said floating gate areas are arranged in rows parallel to said source and drain lines in positions longitudinally staggered in relation to those of an adjacent row in such a manner that the floating gate areas of a row underlie a first plurality of said control gate lines and the floating gate areas of the adjacent row underlie a second plurality of said control gate lines alternating with the first plurality of said control gate lines.

2. Memory matrix in accordance with claim 1 wherein each floating gate area consists of a polysilicon strip which extends parallel to said source and drain lines from one field oxide area to the other placed between said source and drain lines, there being superimposed on said polysilicon strip a layer of dielectric oxide and over that a polysilicon strip forming a single body with a control gate line.

* * * * *

UNITED STATES PATENT AND TRADEMARK OFFICE
CERTIFICATE OF CORRECTION

PATENT NO. : 5,005,060

DATED : April 2, 1991

INVENTOR(S) : Stefano MAZZALI

It is certified that error appears in the above-identified patent and that said Letters Patent is hereby corrected as shown below:

ON THE TITLE PAGE:

[73] Assignee: SGS-Thomson Microelectronics s.r.l
Agrate Brianza, Milano, Italy

Signed and Sealed this

Fifteenth Day of December, 1992

*Attest:*

DOUGLAS B. COMER

*Attesting Officer*      *Acting Commissioner of Patents and Trademarks*